(12) United States Patent
Brown et al.

(10) Patent No.: US 8,558,242 B2
(45) Date of Patent: Oct. 15, 2013

(54) VERTICAL GAN-BASED METAL INSULATOR SEMICONDUCTOR FET

(75) Inventors: Richard J. Brown, Los Gatos, CA (US); Hui Nie, Cupertino, CA (US); Andrew Edwards, San Jose, CA (US); Isik Kizilyalli, San Francisco, CA (US); David Bour, Cupertino, CA (US); Thomas Prunty, Santa Clara, CA (US); Linda Romano, Sunnyvale, CA (US); Madhan Raj, Cupertino, CA (US)

(73) Assignee: Avogy, Inc., San Jose, CA (US)

( * ) Notice: Subject to any disclaimer, the term of this patent is extended or adjusted under 35 U.S.C. 154(b) by 75 days.

(21) Appl. No.: 13/315,705

(22) Filed: Dec. 9, 2011

(65) Prior Publication Data

US 2013/0146885 A1 Jun. 13, 2013

(51) Int. Cl.
*H01L 29/20* (2006.01)

(52) U.S. Cl.
USPC ...... 257/76; 257/200; 257/201; 257/E29.089; 257/E21.09

(58) Field of Classification Search
CPC ................................................ H01L 21/02458
USPC ............... 257/76, 200, 201, E29.089, E21.09
See application file for complete search history.

(56) References Cited

U.S. PATENT DOCUMENTS

| 2005/0145883 A1* | 7/2005 | Beach et al. | 257/194 |
| 2010/0006894 A1* | 1/2010 | Ohta et al. | 257/192 |

* cited by examiner

*Primary Examiner* — Mamadou Diallo
(74) *Attorney, Agent, or Firm* — Kilpatrick Townsend & Stockton LLP

(57) ABSTRACT

A semiconductor structure includes a III-nitride substrate having a top surface and an opposing bottom surface and a first III-nitride layer of a first conductivity type coupled to the top surface of the III-nitride substrate. The semiconductor structure also includes a second III-nitride layer of a second conductivity type coupled to the first III-nitride layer along a vertical direction and a third III-nitride layer of a third conductivity type coupled to the second III-nitride layer along the vertical direction. The semiconductor structure further includes a first trench extending through a portion of the third III-nitride layer to the first III-nitride layer, a second trench extending through another portion of the third III-nitride layer to the second III-nitride layer, and a first metal layer coupled to the second and the third III-nitride layers.

20 Claims, 11 Drawing Sheets

VERTICAL GAN-BASED METAL INSULATOR SEMICONDUCTOR FET

BACKGROUND

Power electronics are widely used in a variety of applications. Power electronic devices are commonly used in circuits to modify the form of electrical energy, for example, from ac to dc, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

Embodiments of the present invention relate to electronic devices. More specifically, the present invention relates to forming a III-nitride based vertical metal-insulator-semiconductor field-effect transistor (MISFET). Merely by way of example, the invention has been applied to methods and systems for manufacturing normally-off MISFETs using gallium-nitride (GaN) based epitaxial layers. The methods and techniques can be applied to a variety of compound semiconductor systems including n-type and p-type MISFETs, which can provide either normally-off or normally-on functionality.

According to an embodiment of the present invention, a semiconductor structure is provided. The semiconductor structure includes a III-nitride substrate having a top surface and an opposing bottom surface and a first III-nitride layer of a first conductivity type coupled to the top surface of the III-nitride substrate. The semiconductor structure also includes a second III-nitride layer of a second conductivity type coupled to the first III-nitride layer along a vertical direction and a third III-nitride layer of a third conductivity type coupled to the second III-nitride layer along the vertical direction. The semiconductor structure further includes a first trench extending through a portion of the third III-nitride layer to the first III-nitride layer, a second trench extending through another portion of the third III-nitride layer to the second III-nitride layer, and a first metal layer coupled to the second and the third III-nitride layers.

According to another embodiment of the present invention, a vertical III-nitride field effect transistor is provided. The vertical III-nitride field effect transistor includes a drain comprising a first III-nitride material and a drain contact electrically coupled to the drain. The vertical III-nitride field effect transistor also includes a drift region comprising a second III-nitride material coupled to the drain and disposed adjacent to the drain along a vertical direction, a channel region comprising a third III-nitride material coupled to the drift region, a gate region coupled to the channel region, and a gate contact electrically coupled to the gate region. The vertical III-nitride field effect transistor further includes a source coupled to the channel region and a source contact electrically coupled to the source. The channel region is disposed between the drain and the source along the vertical direction such that current flow during operation of the vertical III-nitride field effect transistor is along the vertical direction from the source to the drain via the drift region.

According to a specific embodiment of the present invention, a method is provided that includes providing a III-nitride substrate having a top surface and an opposing bottom surface and forming a first III-nitride epitaxial layer over the top surface of the III-nitride substrate. The first III-nitride epitaxial layer is characterized by a first conductivity. The method also includes forming a second III-nitride epitaxial layer over the first III-nitride layer. The second III-nitride epitaxial layer is characterized by a second conductivity opposite of the first conductivity. The method further includes forming a third III-nitride epitaxial layer over the second III-nitride layer. The third III-nitride epitaxial layer is characterized by a third conductivity. Additionally, the method includes removing a portion of the third III-nitride epitaxial layer and the second III-nitride epitaxial layer to form a first trench that extends through a thickness of the third III-nitride epitaxial layer and further protruding into the second III-nitride epitaxial layer and removing another portion of the third III-nitride epitaxial layer, the second III-nitride epitaxial layer, and a portion of the first III-nitride epitaxial layer to form a second trench extending through the thickness of the third III-nitride epitaxial layer, through a thickness of the second III-nitride material, and further protruding into the first III-nitride epitaxial layer. Furthermore, the method includes forming a dielectric layer over the third III-nitride epitaxial layer, forming a first metallic structure electrically coupled to the third III-nitride layer, forming a second metallic structure electrically coupled to the second III-nitride layer, and forming a metal structure overlying the dielectric layer. The metal structure is electrically coupled to the third III-nitride layer via the first metallic structure and to the second III-nitride layer via the second metallic structure.

Numerous benefits are achieved by way of the present invention over conventional techniques. For example, embodiments of the present invention enable the use of thicker III-nitride semiconductor layers in comparison with conventional techniques, which can result in devices capable of operating at higher voltages than conventional devices. Additionally, embodiments of the present invention provide vertical transistor structures, which can allow devices to have greater power density, lower capacitance, and generally better performance. These and other embodiments of the invention, along with many of its advantages and features, are described in more detail in conjunction with the text below and attached figures.

DETAILED DESCRIPTION OF SPECIFIC EMBODIMENTS

Figure 1:
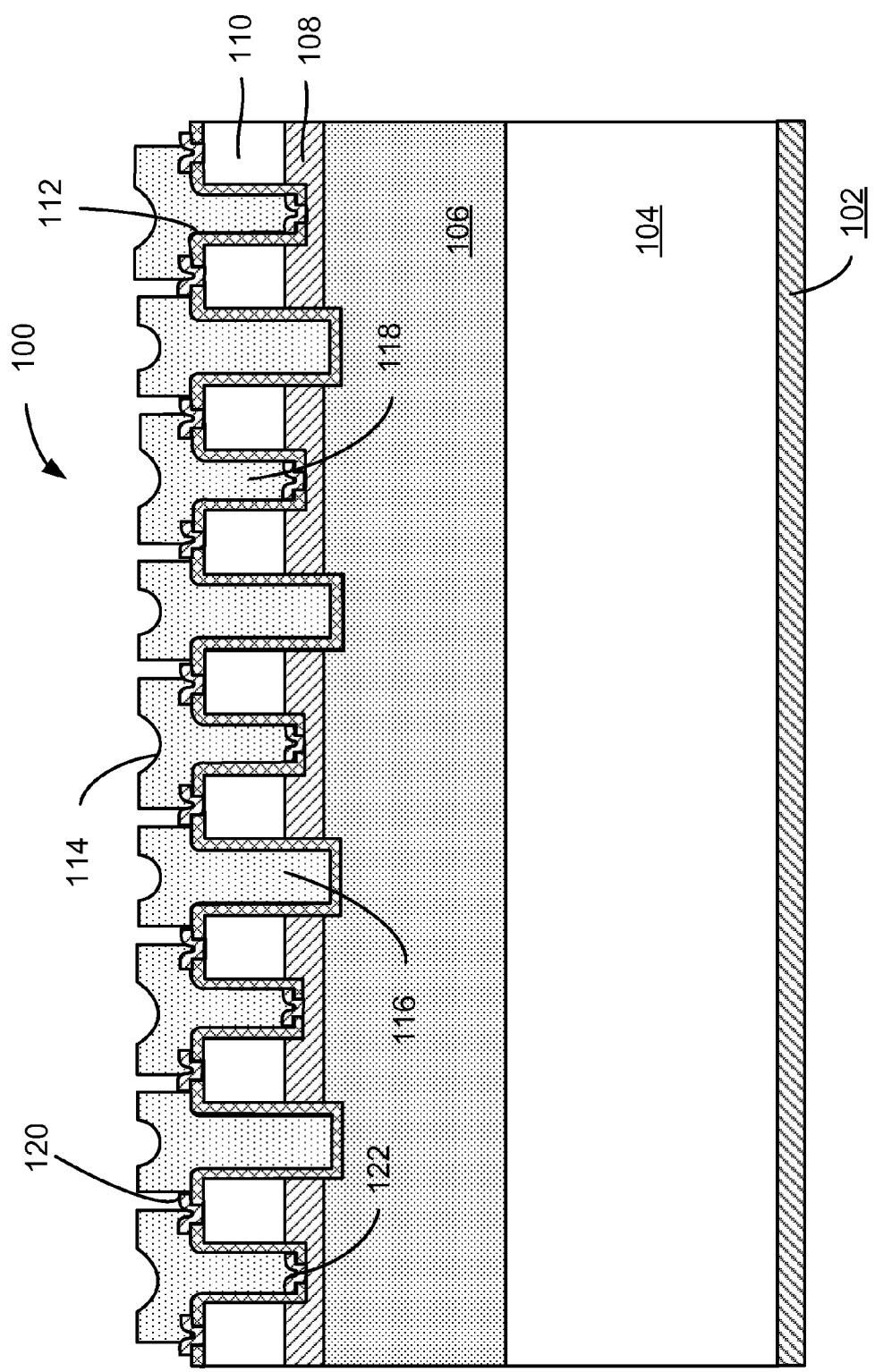
FIG. 1 is a simplified cross-sectional view of a vertical GaN-based device according to an embodiment of the present invention.

The present invention relates generally to electronic devices. More specifically, the present invention relates to forming a III-nitride based vertical metal-insulator-semiconductor field-effect transistor (MISFET). Merely by way of example, the invention has been applied to methods and systems for manufacturing normally-off MISFETs using gallium-nitride (GaN) based epitaxial layers. The methods and techniques can be applied to a variety of compound semiconductor systems including n-type and p-type MISFETs, which can provide either normally-off or normally-on functionality.

According to the present invention, MISFETs include an insulator that provides a high-quality, low interface state density interface with the underlying semiconductor. While MISFETs are currently the most common type of semiconductor devices utilized in Si-based systems, MISFET type devices remain uncommon in the III-Nitride semiconductor systems. While Si based devices may have a high quality Si—SiO$_2$ interface available, there is no analogous native insulator in the III-nitride system. Conventional techniques for fabricating MISFET devices in the III-nitride system have involved the deposition of various dielectrics common to silicon device processing, which is done ex-situ to the III-nitride growth system. Semiconductor-dielectric interfaces in the devices having such dielectric materials have been measured to have varying degrees of interface state density and trapped charge. Such unpredictable features make these dielectrics unsuitable for MIS type FETs fabricated in the III-nitride system. Accordingly, embodiments of the present invention utilize a dielectric deposition method and resulting dielectric that more closely mimics the growth method and properties of the III-nitride semiconductor system, thereby providing metal-insulator-semiconductor (MIS) interfaces that greatly improve the performance of MISFETs in the III-nitride material system.

GaN-based electronic and optoelectronic devices are undergoing rapid development. Desirable properties associated with GaN and related alloys and heterostructures include high bandgap energy for visible and ultraviolet light emission, favorable transport properties (e.g., high electron mobility and saturation velocity), a high breakdown field, and high thermal conductivity. According to embodiments of the present invention, gallium nitride (GaN) epitaxy on pseudo-bulk GaN substrates is utilized to fabricate vertical GaN-based semiconductor devices not possible using conventional techniques. For example, conventional methods of growing GaN include using a foreign substrate such as silicon carbide (SiC), sapphire, etc. Fabrication of GaN-based FETs on a foreign substrate such as sapphire often involves use of nucleation layers for promoting the growth of the GaN-based layers. However, these nucleation layers impede current flow in the resulting device. High defect densities at the interface between GaN and the foreign substrate further complicate attempts to create vertical devices, including MISFETs and other field-effect transistors.

Homoepitaxial GaN layers on bulk GaN substrates, on the other hand, are utilized in the embodiments described herein to provide superior properties to conventional techniques and devices. For instance, electron mobility, μ, is higher for a given background doping level, N. This provides low resistivity, ρ, because resistivity is inversely proportional to electron mobility, as provided by equation (1):

$$\rho = \frac{1}{q\mu N}, \quad (1)$$

where q is the elementary charge.

Another superior property provided by homoepitaxial GaN layers on bulk GaN substrates is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by the equation:

$$R = \frac{\rho L}{A}, \quad (2)$$

where A is the cross-sectional area of the channel or current path.

In general, a tradeoff exists between the physical dimension of a device needed to support high voltage in a device's off-state and the ability to pass current through the same device with low resistance in the on-state. In many cases GaN is preferable over other materials in minimizing this tradeoff and maximizing performance. In addition, GaN layers grown on bulk GaN substrates have low defect density compared to layers grown on mismatched substrates. The low defect density will give rise to superior thermal conductivity, less trap-related effects such as dynamic on-resistance, and better reliability.

Among the vertical device structures contemplated is a vertical MISFET. Depending on doping levels, physical dimensions, conductivity type (e.g., n-type or p-type materials), and other factors, vertical MISFETs can be designed to have normally-off or normally-on functionality. A normally-off vertical MISFET is particularly useful due to its ability to prevent current flow if no voltage is applied to the gate, which can serve as, among other things, a safety feature for vertical MISFETs used in power applications.

In addition to the ability to support high-voltage, low-resistance MISFET applications, the GaN vertical MISFETs described herein can differ from traditional vertical MISFETs in other ways. For example, other semiconductors used to manufacture vertical MISFETs, such as SiC can be utilized, altering the mode of manufacture. Furthermore, the use of GaN epitaxial layers can allow for non-uniform dopant concentrations as a function of thickness within the various layers of the vertical MISFET, which can optimize the performance of the device.

FIG. 1 is a simplified cross-sectional diagram illustrating a vertical GaN-based device 100 according to an embodiment of the present invention. Referring to FIG. 1, a drain 102 is provided. According to the embodiment of the present invention illustrated in FIG. 1, bulk substrate 104 is an n-type GaN substrate, but the present invention is not limited to this particular material. In other embodiments, substrates with p-type doping are utilized. Additionally, although a GaN substrate is illustrated in FIG. 1, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, and quaternary III-V (e.g., III-nitride) materials such as AlInGaN are included within the scope of the present invention. Additionally, embodiments can use materials having an opposite conductivity type to provide devices with different functionality. For example, embodiments provided herein focus on the formation of a MISFET with an n-type drain and channel regions. However, a p-type MISFET can be formed by using materials with opposite conductivity (e.g., substituting p-type materials for n-type materials, and vice versa) in a similar manner as will be evident to one of skill in the art.

Bulk substrate 104 is electrically coupled to drain 102. A drift region 106 is disposed over bulk substrate 104. Drift region 106 provides a medium through which current can flow in the device's on-state in a vertical direction from the source to drain 102. In some embodiments, drift region 106 is between 1 μm and 100 μm in thickness. In some embodiments, drift region 106 may include a n-type GaN material. In a specific embodiment the GaN material of drift region 106 has a n⁻-type conductivity (i.e., low doped n-type material). In the off-state, drift region 106 provides a medium for supporting the electric field created by the voltage gradient between the source or gate and drain 102. A blocking layer 108 is disposed over drift region 106. Blocking layer 108 blocks conduction of current from the source to the drain when the gate voltage is below a threshold voltage. In some embodiments, blocking layer 108 can include a p-type GaN material and may be between 0.1 μm and 2 μm thickness. In a specific embodiment, blocking layer 108 may have a p⁺-type of conductivity ranging from about $1 \times 10^{16}$ cm⁻³ to about $1 \times 10^{18}$ cm⁻³, although embodiments of the present invention are not limited to this doping type or to particular doping concentrations.

Source region 110 is disposed over blocking layer 108. In some embodiments, source region includes a n-type GaN material. In some embodiments, source region 110 may be 0.05 μm to 0.5 μm thick and may have a n⁺-type conductivity ranging from about $1 \times 10^{18}$ cm⁻³ to about $1 \times 10^{20}$ cm⁻³. A trench 116 extends through source region 110 and blocking layer 108 into drift region 106. Trench 116 effectively divides source region 110 into two source regions. This creates two channels for current flow as illustrated and described below in relation to FIGS. 2A and 2B. Another trench 118 extends through source region 110 into blocking layer 108. In some embodiments, there may be more than one trench 118 in a MISFET device enabling the two channel operation. Trench 118 enables the formation of the source contact that is electrically coupled to blocking layer 108 to prevent parasitic bipolar junction during the operation A layer of a dielectric material 112 is disposed over source region 110. Dielectric layer 112 is conformal over source region 110 and trenches 116 and 118 in the illustrated embodiment. Dielectric layer 112 provides isolation between portions of a metal layer 114 and source region 110 and blocking layer 108. In some embodiments, dielectric layer 112 may include III-nitride material such as AlGaN, AlN, or dielectric materials, and may have a thickness ranging from about 10 nm to about 1,000 nm. In some embodiments, the thickness ranges from the tens of nanometers to the hundreds of nanometers. Metal layer 114 is disposed over dielectric layer 112 such that metal layer 114 fills trenches 116 and 118. A gate contact is provided in a portion of metal layer that fills trench 116. The gate contact is isolated from source region 110 and blocking layer 108 by dielectric layer 112. Source contacts are provided in metal layer 114. Source contacts are coupled to source region 110 via ohmic contact 120 and are also coupled to blocking layer 108 via another ohmic contact 122. Both ohmic contacts 120 and 122 pass through dielectric layer 112 to electrically couple the source contacts to the source and the blocking layer, respectively. The two source contacts are isolated from the gate contact by a break in metal layer 114. In some embodiments, metal layer 114 may include aluminum, copper, or any other suitable metal.

Figures 2A, 2B:
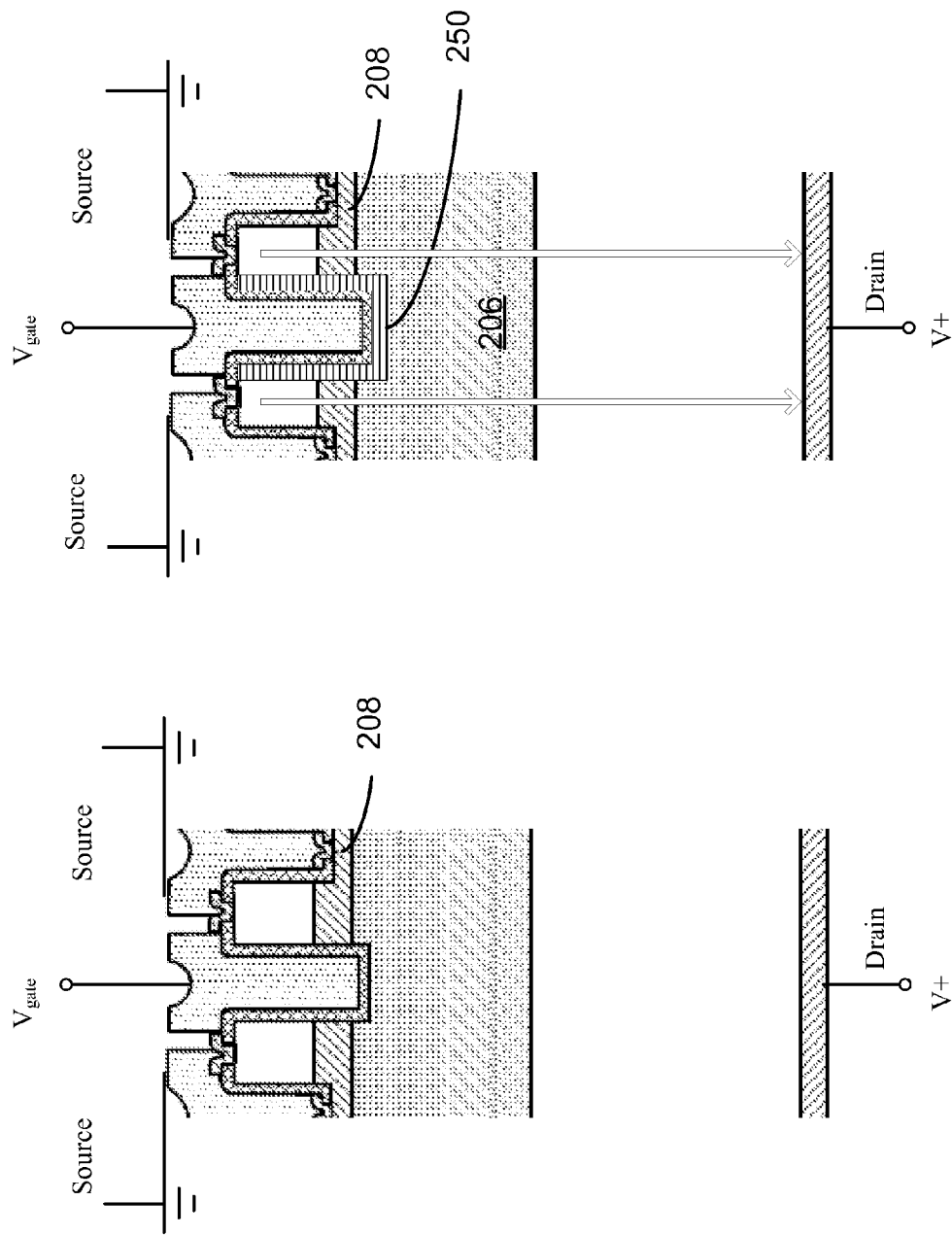
FIGS. 2A and 2B are simplified cross-sectional diagrams illustrating the operational functionality of the vertical GaN-based device illustrated in FIG. 1 according to an embodiment of the present invention.

The operation of the MISFET is described in relation to FIGS. 2A and 2B. FIG. 2A illustrates the MISFET 200 in a "off" state. In the "off" state, the gate bias/voltage $V_{gate}$ is less than a threshold voltage $V_{threshold}$ and does not overcome the barrier presented by blocking layer 208. In this instance, blocking layer 208 blocks any current flow from the source to the drain. The threshold voltage $V_{threshold}$ can be adjusted by adjusting the thickness or doping density of blocking layer 208 and/or of drift region 206. Once the gate voltage $V_{gate}$ exceeds the threshold voltage $V_{threshold}$, an inversion layer 250 is formed in blocking layer 208 thereby coupling the source to the drain via drift region 206. This enables the free flow of electrons from the source to the drain and the MISFET is now in the "on" state as illustrated in FIG. 2B. Since there are dual source regions in the MISFET as described above, the electron flow occurs in two channels, each associated with one of the sources.

Figure 3A:
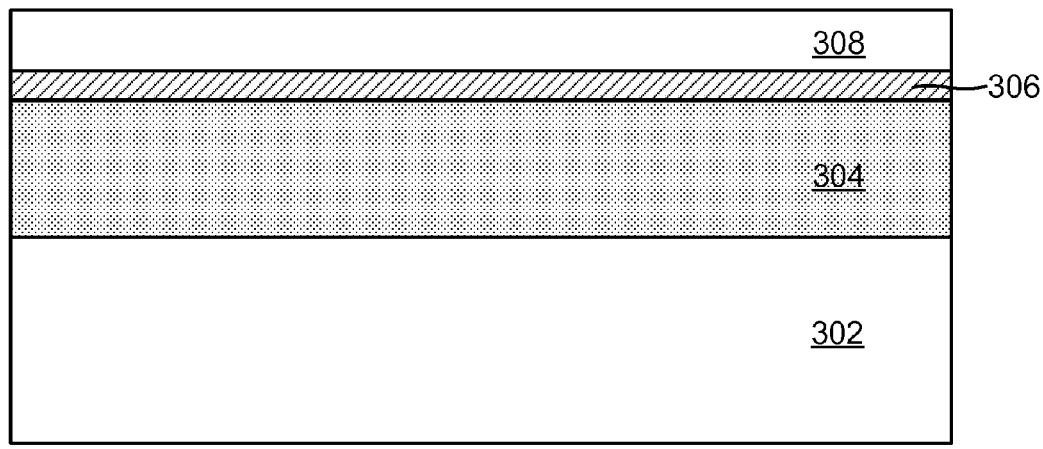
FIGS. 3A-3K are simplified cross-sectional diagrams illustrating the fabrication of a vertical GaN-based metal insulator semiconductor field effect transistor (MISFET) according to an embodiment of the present invention.

FIGS. 3A-3K are simplified cross-sectional diagrams illustrating the fabrication of a vertical GaN-based MISFET according to an embodiment of the present invention. As illustrated in FIG. 3A, a bulk III-nitride substrate 302 is provided that has a top surface and a bottom surface. As indicated above, the III-nitride substrate 302 can be a pseudo-bulk GaN material. Dopant concentrations (e.g., doping density) of substrate 302 can vary. For example, substrate 302 can have an n+ conductivity type, with dopant concentrations ranging from $1 \times 10^{17}$ cm⁻³ to $1 \times 10^{19}$ cm⁻³. Although substrate 302 is illustrated as including a single material composition, multiple layers can be provided as part of the substrate. Moreover, adhesion, buffer, and other layers (not illustrated) can be utilized during the epitaxial growth process. One of ordinary skill in the art would recognize many variations, modifications, and alternatives.

A first III-nitride layer 304 (e.g., GaN) is epitaxially grown over the top surface of substrate 302 and doped appropriately to provide it with an n-type conductivity. The properties of first epitaxial layer 304 can also vary, depending on desired functionality. First epitaxial layer 304 can serve as a drift region for the MISFET, and therefore can be a relatively low-doped material. For example, first epitaxial layer 304 can have an n⁻ conductivity type, with dopant concentrations ranging from $1 \times 10^{14}$ cm⁻³ to $1 \times 10^{18}$ cm⁻³. Furthermore, the dopant concentration can be uniform, or can vary, for example, as a function of the thickness of first epitaxial layer 304.

The thickness of first GaN epitaxial layer 304 can also vary substantially, depending on the desired functionality. For example, homoepitaxial growth can enable first epitaxial layer 304 to be grown far thicker than layers formed using conventional methods. In general, in some embodiments, thicknesses can vary between about 1 μm and about 100 μm for applications that cover the spectrum from low voltage devices to very high voltage breakdown devices. Resulting breakdown voltages for the vertical MISFET can vary depending on the embodiment. Some embodiments provide for breakdown voltages of at least 100V, 300V, 600V, 1.2 kV, 1.7 kV, 3.3 kV, 5.5 kV, 13 kV, or 20 kV. Different dopants can be used to create n- and p-type GaN epitaxial layers and structures disclosed herein. For example, n-type dopants can include silicon, oxygen, or the like. P-type dopants can include magnesium, beryllium, zinc, or the like.

A second GaN layer 306 is epitaxially grown over first epitaxial layer 304. Second GaN epitaxial layer 306 which eventually comprises the blocking layer/channel for the MISFET is usually a thin layer and has a low-dopant concentration. In some embodiments, the dopant concentration of second GaN epitaxial layer 306 can be equal to or less than the dopant concentration of first epitaxial layer 304, depending on the desired threshold voltage for the vertical MISFET. In some embodiments, second GaN epitaxial layer 306 may have a p-type conductivity. It should be noted that the conductivity type would be p-type if layer 308 is n-type. As discussed in relation to the first epitaxial layer 304, and is as applicable to subsequent layers, adhesion layers, buffer layers, and the like, can be utilized during the epitaxial growth process as appropriate to the particular device structure fabricated.

A third GaN layer 308 is epitaxially grown over second GaN layer 306. Third GaN epitaxial layer 308, which eventually comprises the source region for the MISFET, can be a highly-doped epitaxial layer of the same conductivity type as III-nitride substrate 302. In general, the dopant concentration of third GaN epitaxial layer 308 can exceed the dopant concentrations of first and second GaN epitaxial layers 304 and 306. For example, an n-type dopant concentration of third GaN epitaxial layer 308 can be equal to or greater than $1 \times 10^{18}$ cm$^{-3}$. In some embodiments, third GaN epitaxial layer 308 can have a thickness of up to 500 nanometers or thicker depending on the particular implementation. The thickness of second GaN epitaxial layer 306 determines the gate length of the resulting MISFET. In some embodiments, third GaN epitaxial layer 306 is made thick enough to prevent the source from fully depleting it during operation.

Figure 3B:
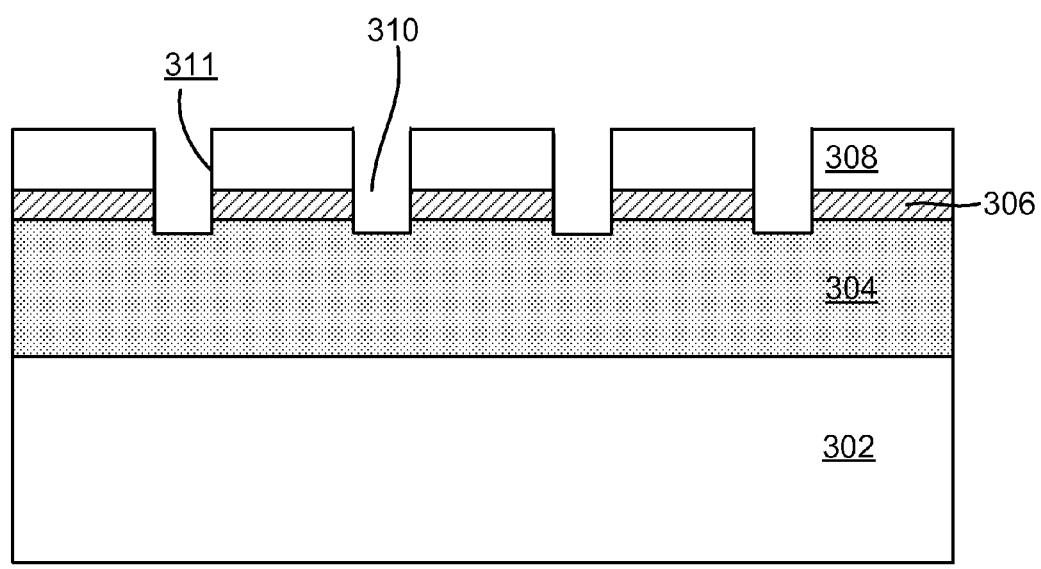

Thereafter, a masking layer (not shown) is applied over third GaN epitaxial layer 308 and a pattern is etched in the underlying material using the masking layer. Inductively-coupled plasma (ICP) etching and/or other GaN etching processes can be used. The etching process results in removal of at least a portion of each of third GaN epitaxial layer 308, second GaN epitaxial layer 306, and first epitaxial layer 304. As a result one or more trenches 310 are formed as illustrated in FIG. 3B. The masking layer is then stripped off using removal techniques to form the structure illustrated in FIG. 3B. Each trench 310 extends through third GaN epitaxial layer 308 to an upper portion of first epitaxial layer 304 as shown. The etch chemistry is chosen so as to reduce or minimize damage to the sidewalls of trench 310. In some embodiments, sidewall 311 of trench 310 can be substantially vertical. Trench 310 will eventually become part of the gate region of the MISFET.

Figure 3C:
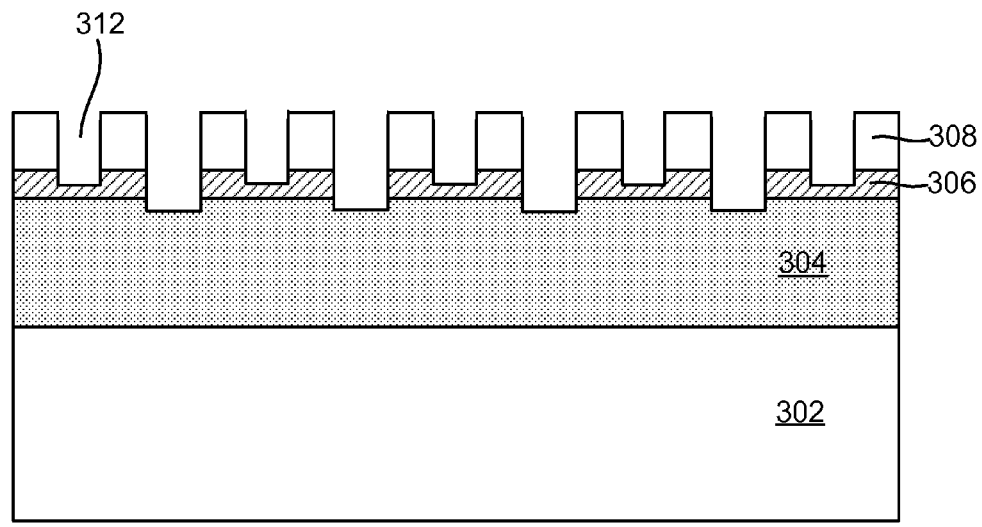

Referring to FIG. 3C, a second masking layer (not shown) is then applied over the remaining portions of third GaN epitaxial layer 308 and a pattern is defined using lithography techniques. Thereafter the pattern is used to etch the underlying material using an etching technique to form trench 312. The etch results in removal of at least another portion of third GaN epitaxial layer 308 and second GaN epitaxial layer 306. The masking layer is then removed to reveal the structure illustrated in FIG. 3C. As a result of this etch, both third GaN epitaxial layer 308 and second GaN epitaxial layer 306 are now accessible from the top side of the structure. Like trench 310, it is desirable that the sidewalls of trench 312 are substantially vertical.

Figure 3D:
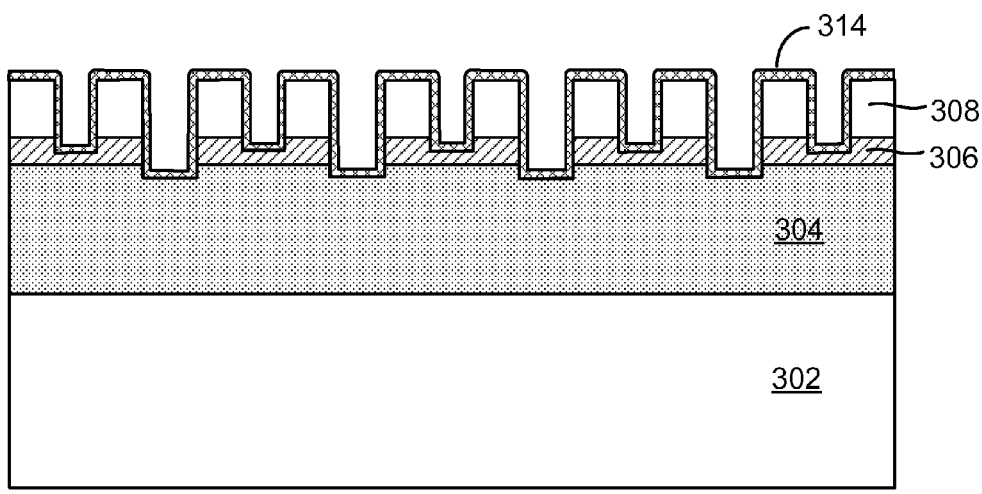

As illustrated in FIG. 3D, a conformal dielectric layer 314 is then deposited over the exposed region of the top surface. Dielectric layer 314 is deposited such that it lines each of the trenches 310, 312 and portions of third GaN epitaxial layer 308. Dielectric layer 314 can be deposited using Metal-Organic Chemical Vapor Deposition (MOCVD) techniques, Atomic Layer Deposition (ALD) techniques, combinations thereof, or the like. In some embodiments, dielectric layer 314 is greater than 95% conformal. The deposition of dielectric layer 314 is controlled so as to provide a good GaN-dielectric interface. In some embodiments, dielectric layer 314 can include, silicon dioxide, silicon oxynitride, silicon nitride, silicon aluminum nitride, silicon gallium nitride, combinations thereof, and the like. Embodiments of the present invention provide advantages in comparison with conventional techniques since the deposition methods utilized in some implementations (e.g., MOCVD based growth at high temperature) provide conditions similar to those utilized during GaN growth.

Figure 3E:
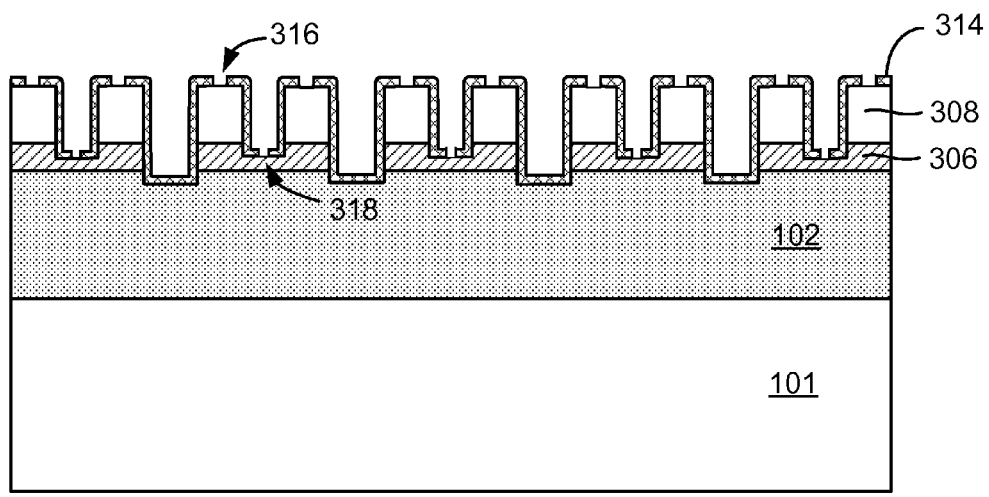

Thereafter another masking layer (not shown) is applied over dielectric layer 314 and a pattern is formed in the masking layer. The pattern is used to remove a portion of dielectric layer 314. The etching results in formation of several openings 316 and 318 in the dielectric layer that can be used to access sections of third GaN epitaxial layer 308 and second GaN epitaxial layer 306, respectively, as illustrated in FIG. 3E.

Figure 3F:
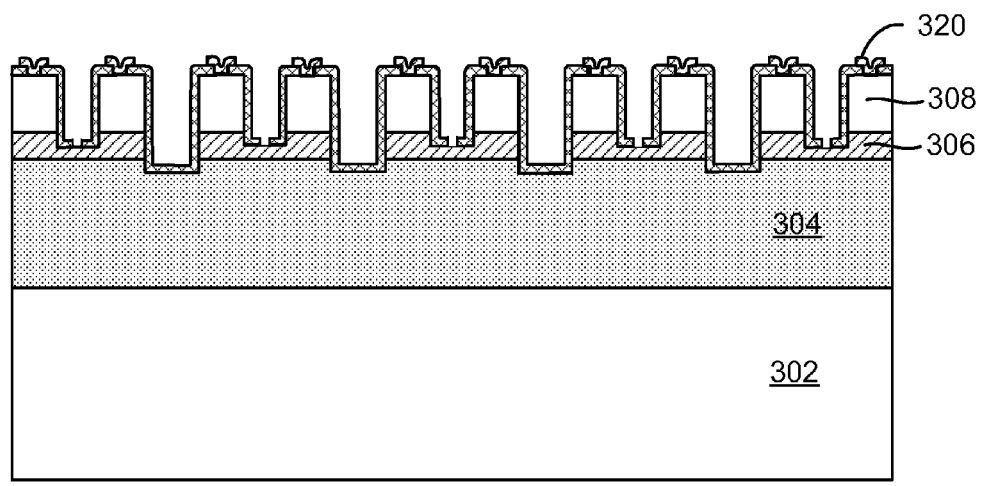

A first shadow masking layer (not shown) is then defined using lithography techniques so that openings 316 in dielectric layer 314 are exposed so that ohmic contacts can be formed to third GaN epitaxial layer 308. A metal layer is then deposited over the shadow masking layer. The deposition of the metal layer results in the metal filling the openings 316, thereby forming a metallic structure 320, as illustrated in FIG. 3F. In some embodiments, metallic structure 320 can include a titanium-aluminum (Ti/Al) ohmic metal. In some embodiments, metallic structure 320 may be referred to as an ohmic contact. The remaining metal layer and the masking layer is then removed to reveal the structure illustrated in FIG. 3F.

Figure 3G:
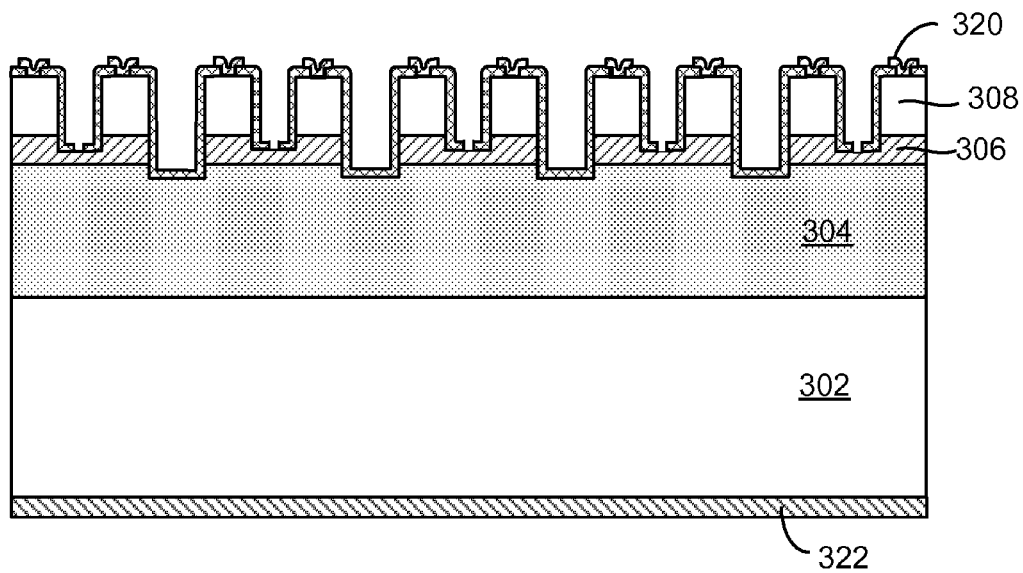
Figure 3H:
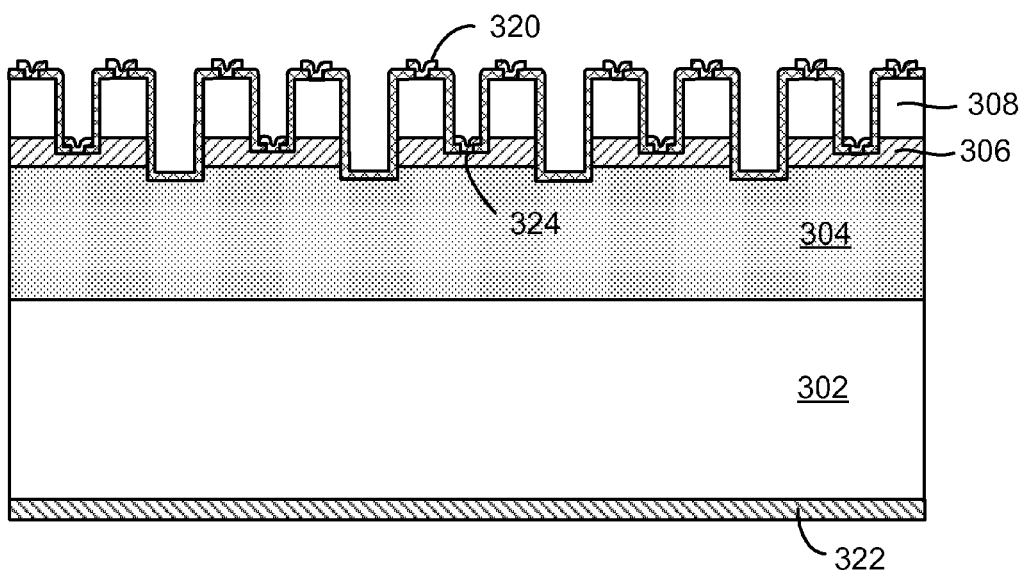

As illustrated in FIG. 3G, a metal layer 322 is deposited on the bottom surface of substrate 302. Metal layer 322 will eventually comprise the drain contact of the MISFET. In some embodiments, metal layer 322 may include a metallization similar to metallic structure 320. The structure is then used as-deposited or annealed at a temperature ranging up to about 900° C. to activate metallic structure 320 and drain contact 322. A second shadow masking layer is defined over the top surface of the structure and patterned so that openings 318 are exposed. A metal layer (not shown) is then deposited onto the second shadow masking layer followed by an etching process similar to the one described in relation to FIG. 3F. The metal layer fills openings 318 to form a second set of metallic structures 324, as illustrated in FIG. 3H. Metallic structures 324 allow connection to second GaN epitaxial layer 306. In some embodiments, metallic structures 324 can include nickel, palladium, platinum ohmic contacts suitable for use with p-type materials. These contacts to p-type material will likely be different than those used for metallic structure 320, for example, a high work function material such as Ni, Pd, or Pt, with an overlayer of Au. This metallization is generally annealed at a lower temperature than metallic structure 320 although this is not required by the present invention. Metallic structures eventually become part of the source contacts for the MISFET.

Figure 3I:
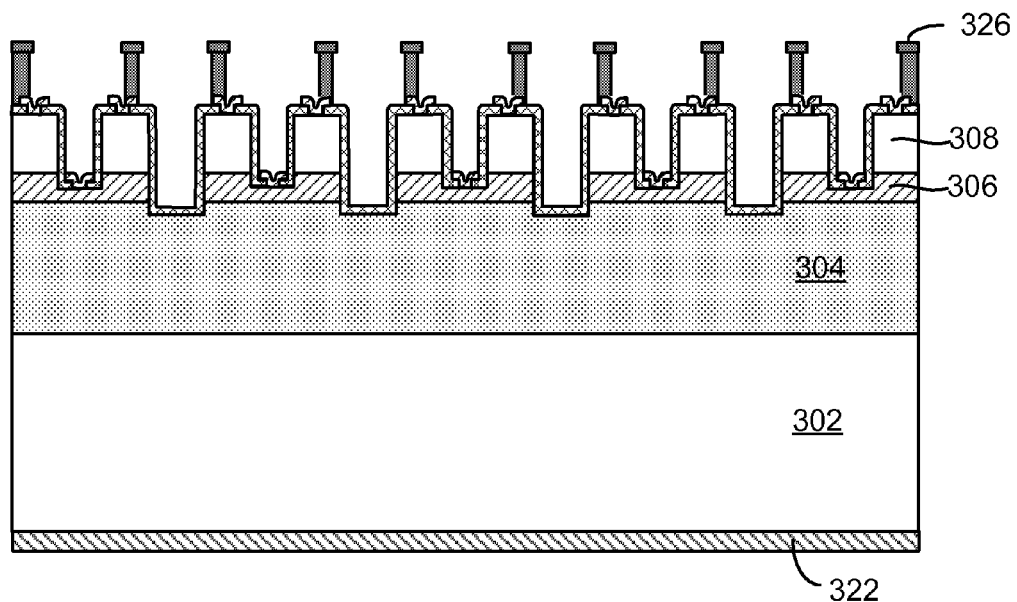
Figure 3J:
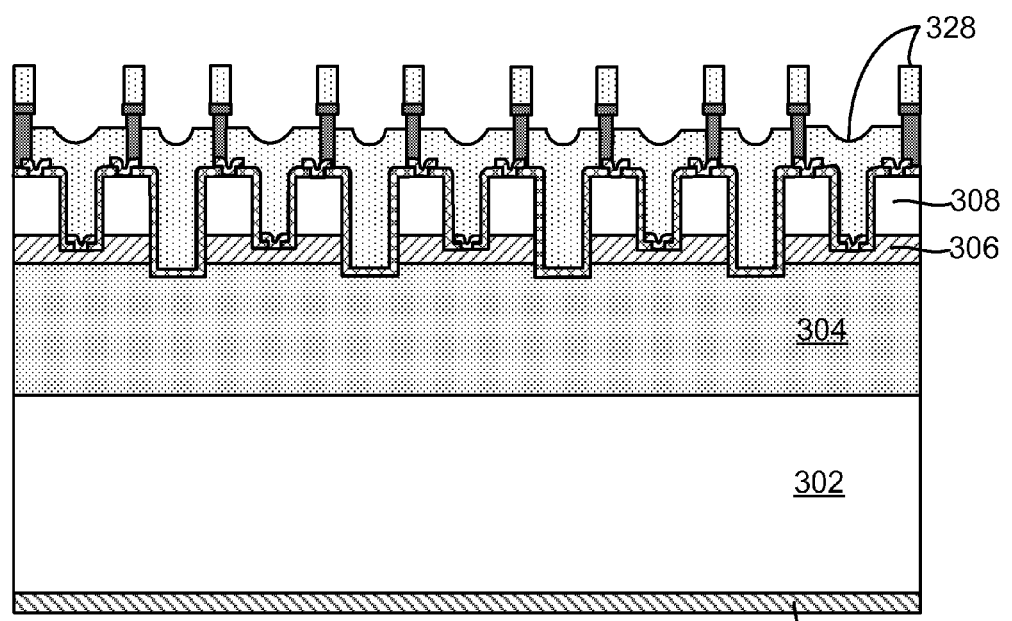

A third shadow masking layer 326 is then deposited over dielectric layer 314 as illustrated in FIG. 3I. Third shadow masking layer 326 is used in the formation of gate contacts for the MISFET. Once third shadow masking layer 326 is patterned, a gate metal layer 328 is deposited over dielectric layer 314, third shadow masking layer 326, and metallic structures 320 and 324 as illustrated in FIG. 3J. Gate metal layer 328 is deposited such that it fills trenches 310 and 312 and electrically couples metallic structure 320 to metallic structure 324. In some embodiments, gate metal layer 328 can include gold, tantalum, tungsten, palladium, silver, or aluminum, combinations thereof, and the like.

Figure 3K:
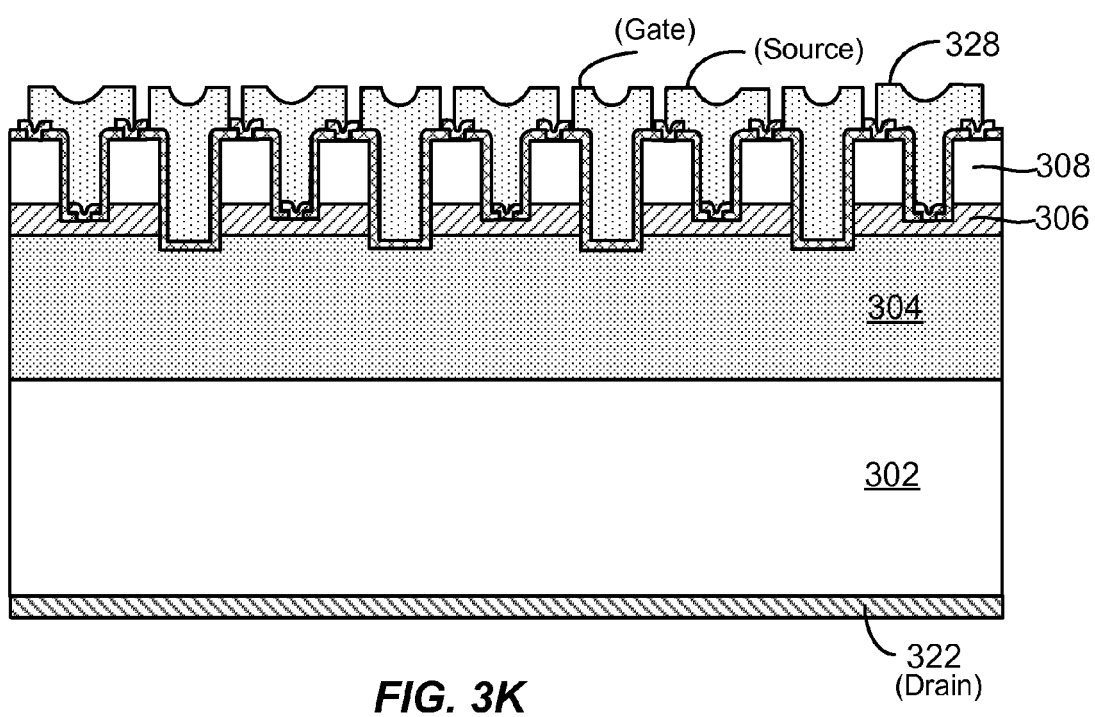

Thereafter, portions of gate metal layer 328 that are deposited over third shadow masking layer 326 are etched away along with third shadow masking layer 326 to form the final structure as illustrated in FIG. 3K.

As appropriate for MISFET operation, it is desirable that the source contacts be electrically coupled to third epitaxial layer 308 and second epitaxial layer 306. Otherwise, a parasitic P—N—P bipolar transistor can be formed near the source region, thus degrading the performance of the MISFET. In addition, to create the inversion layer in second epitaxial layer 306, as described above, the bias is applied between the gate and second epitaxial layer 306. In order to form this inversion layer, an electrical connection is provided between the source contact and second epitaxial layer 306.

Figure 4A:
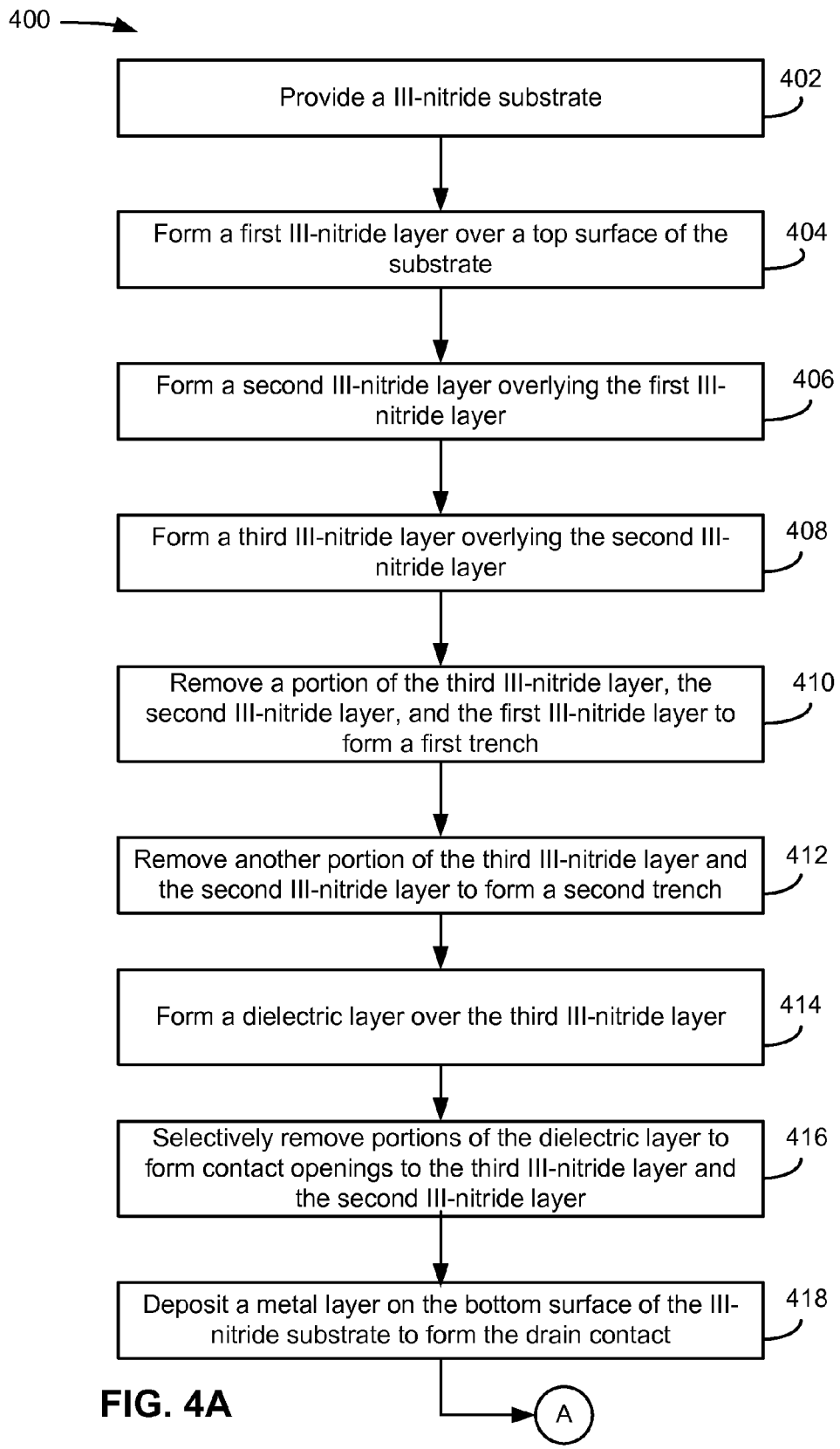
FIGS. 4A and 4B is a simplified flowchart illustrating a method of fabricating a vertical GaN-based MISFET according to an embodiment of the present invention.
Figure 4B:
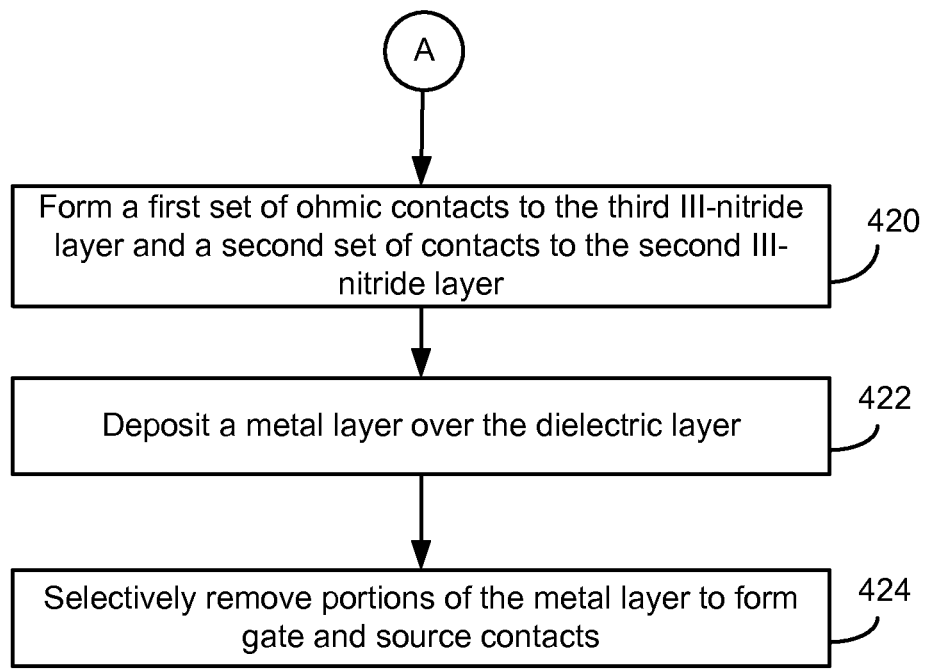

FIGS. 4A and 4B illustrate a flow diagram of a process 400 for fabricating a MISFET according to an embodiment of the present invention. Initially a III-nitride substrate is provided (402). In an embodiment, the III-nitride substrate is an n-type GaN substrate. Thereafter a first III-nitride layer (e.g., an n-type GaN epitaxial layer) is formed over a top surface of the substrate (404). The first III-nitride epitaxial layer is characterized by a first dopant concentration, for example n-type doping. Using the homoepitaxy techniques described herein, the thickness of the first III-nitride epitaxial layer can be thicker than those available using conventional techniques, for example, between about 0.25 µm and 100 µm, more particularly between about 1 µm and 100 µm, for example, between about 2 µm and 20 µm.

The process further includes forming a second III-nitride layer of an opposite type of conductivity from the first III-nitride epitaxial layer (e.g., an p-type GaN epitaxial layer) overlying the first III-nitride layer (406). The second III-nitride layer can have higher dopant concentration than the first III-nitride layer. A third III-nitride epitaxial layer (e.g., an n-type GaN epitaxial layer) can be formed over the second III-nitride layer (408). In an embodiment, the third III-nitride layer has the same conductivity as the first III-nitride layer. Thereafter a portion of the III-nitride layer, the second III-nitride layer, and the first III-nitride layer is removed to form a first trench (410). The removal process can include a masking and an etching process that can include physical etching components as well as chemical etching components.

A second removal process may be performed to form a second trench that extends from the third III-nitride layer down into the second III-nitride layer by removing a portion of these layers (412). The removal process can include a masking and an etching process that can include physical etching components as well as chemical etching components. A dielectric layer may be formed overlying the entire surface of the structure after the second removal process (414). In an embodiment, the dielectric layer overlies portions of the third III-nitride layer and forms a conformal coating on the inner walls of the first and the second trench. As illustrated above, the dielectric layer can form a liner in the first and second trench. In some embodiments, the dielectric layer is deposited using MOCVD or ALD techniques or combinations of these techniques. In an embodiment, the dielectric layer may be a multilayer structure including two or more layers of the same or different dielectric materials. According to some embodiments, the deposition techniques used to deposit the dielectric layer provide a semiconductor-dielectric interface with low defect density and high interfacial quality.

Process 400 further includes depositing a metal layer on the bottom surface of the substrate to form a drain contact (418). Referring to FIG. 4B, a first and second set of ohmic contacts can then be formed by selectively removing portions of the dielectric layer, e.g., using successive masking, patterning, metal deposition, and etching processes (420). In an embodiment, the first set of ohmic contacts provide a means for electrical connection to the third III-nitride layer while the second set of ohmic contacts provide a means for electrical connection to the second III-nitride layer or the channel layer. Thereafter a metal layer can be deposited over the two sets of ohmic contacts and the remaining portion of the dielectric layer (422). Process 400 may further include selectively removing portions of the metal layer to form the source and the gate contacts (424).

It should be appreciated that the specific steps illustrated in FIG. 4 provide a particular method of fabricating a vertical GaN-based MISFET according to an embodiment of the present invention. Other sequences of steps may also be performed according to alternative embodiments. For example, alternative embodiments of the present invention may perform the steps outlined above in a different order. Moreover, the individual steps illustrated in FIG. 4 may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 5A:
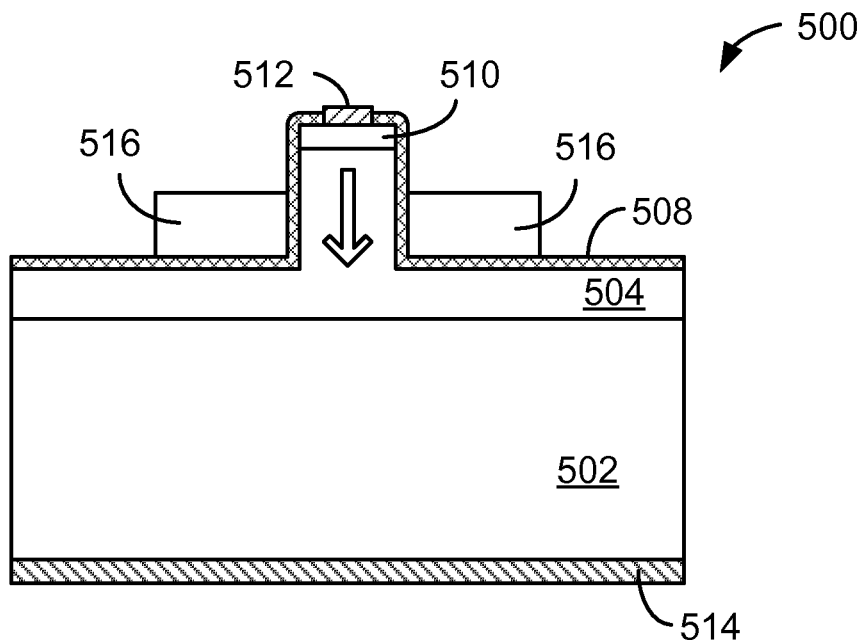
FIGS. 5A and 5B are simplified cross-sectional diagrams illustrating the operational functionality of a vertical GaN-based device according to another embodiment of the present invention.
Figure 5B:
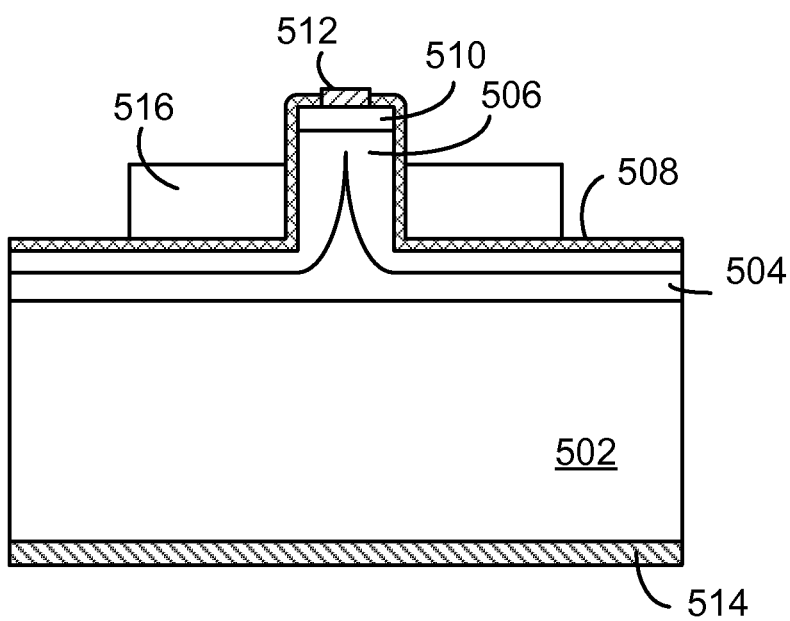

FIGS. 5A and 5B illustrate a cross sectional view of a portion of a vertical GaN MISFET according to another embodiment of the present invention. As described above, a MISFET can be operated in two different modes, e.g., normally "off" and normally "on." Sometimes, the normally "off" mode is referred to as the enhancement mode and the normally "on" mode is referred to as the depletion mode.

FIG. 5A illustrates a portion of a MISFET 500 that operates in the normally "on" or depletion mode according to an embodiment of the present invention. MISFET 500 includes a bulk GaN substrate 502. A n⁻ type GaN epitaxial drift layer 504 is disposed over n⁺ substrate 502 in the illustrated embodiment. In some embodiments, drift layer 504 may have a n-type conductivity. A n⁺ GaN epitaxial source layer 510 is disposed over a portion of drift region 504. A conformal insulator layer 508 is disposed over drift layer 504 and source layer 510. In some embodiments, insulator layer 508 may be similar to layer 314 described above. A source contact 512 is disposed such that it contacts source layer 510 through insulator layer 508. In some embodiments, source contact 512 includes metal and may be similar to contacts 320 described above. Gates regions 516 are disposed on either side of the source. A drain region 514 is disposed on the other surface of substrate 502.

In operation, even without any bias applied to the gate, a conductive channel is deliberately formed beneath the insulator layer and between the source and drain due to selective doping of the drift and source layers. Thus, MISFET 500 is "on" or conducting when there is no bias applied to the gate.

When a more negative voltage than the threshold voltage is applied to the gate, e.g., $-V_{Threshold}$ or $-V_{Gate}$ (off), it results in "depleting" or shutting off the majority current carriers in the pre-formed channel beneath the gate. This creates a depletion region 506 as illustrated in FIG. 5B. As the size of depletion region 506 under the gate area increases, the channel resistance increases and reduces the current flow. At some point depletion region 506 may increase to a point where the channel is pinched off resulting in a complete blockage of current flow through MISFET 500.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A semiconductor structure comprising:
    a III-nitride substrate having a top surface and an opposing bottom surface;
    a first III-nitride layer of a first conductivity type coupled to the top surface of the III-nitride substrate;
    a second III-nitride layer of a second conductivity type coupled to the first III-nitride layer along a vertical direction;
    a third III-nitride layer of a third conductivity type coupled to the second III-nitride layer along the vertical direction;
    a first trench extending through a portion of the third III-nitride layer to the first III-nitride layer;
    a second trench extending through another portion of the third III-nitride layer to the second III-nitride layer;
    a first metal layer coupled to the second and the third III-nitride layers; and
    a second metal layer coupled to the bottom surface of the III-nitride substrate.

2. The semiconductor structure of claim 1 wherein a sidewall of each of the first trench and the second trench is lined by a layer of dielectric material.

3. The semiconductor structure of claim 1 wherein a thickness of the second III-nitride layer ranges from about 100 nanometers to about 2,000 nanometers.

4. The semiconductor structure of claim 1 wherein the second III-nitride layer comprises one of AlGaN or InGaN.

5. The semiconductor structure of claim 1 wherein the third III-nitride layer is characterized by a thickness of up to 500 nanometers.

6. The semiconductor structure of claim 1 wherein a dopant concentration of the third III-nitride layer is between $1 \times 10^{18}$ cm$^{-3}$ and $1 \times 10^{20}$ cm$^{-3}$.

7. A vertical III-nitride field effect transistor comprising:
    a drain comprising an n$^+$ type material;
    a drain contact electrically coupled to the drain;
    a drift region comprising a second III-nitride material coupled to the drain and disposed adjacent to the drain along a vertical direction;
    a channel region comprising a third III-nitride material coupled to the drift region;
    a gate region coupled to the channel region;
    a gate contact electrically coupled to the gate region;
    a source coupled to the channel region; and
    a source contact electrically coupled to the source;
    wherein the channel region is disposed between the drain and the source along the vertical direction such that current flow during operation of the vertical III-nitride field effect transistor is along the vertical direction from the source to the drain via the drift region.

8. The vertical III-nitride field effect transistor of claim 7 wherein the second III-nitride material comprises an n$^-$ type GaN epitaxial layer having a dopant concentration less than or equal to a dopant concentration of the n$^+$ type material.

9. The vertical III-nitride field effect transistor of claim 7 wherein the channel region comprises a p-type III-nitride material.

10. The vertical III-nitride field effect transistor of claim 7 wherein the source comprises a III-nitride material having an n$^+$ type.

11. A method comprising:
    providing a III-nitride substrate having a top surface and an opposing bottom surface;
    forming a first III-nitride epitaxial layer over the top surface of the III-nitride substrate, wherein the first III-nitride epitaxial layer is characterized by a first conductivity;
    forming a second III-nitride epitaxial layer over the first III-nitride layer, wherein the second III-nitride epitaxial layer is characterized by a second conductivity opposite of the first conductivity;
    forming a third III-nitride epitaxial layer over the second III-nitride layer, wherein the third III-nitride epitaxial layer is characterized by a third conductivity;
    removing a portion of the third III-nitride epitaxial layer and the second III-nitride epitaxial layer to form a first trench extending through a thickness of the third III-nitride epitaxial layer and further protruding into the second III-nitride epitaxial layer;
    removing another portion of the third III-nitride epitaxial layer, the second III-nitride epitaxial layer, and a portion of the first III-nitride epitaxial layer to form a second trench extending through the thickness of the third III-nitride epitaxial layer, through a thickness of the second III-nitride material, and further protruding into the first III-nitride epitaxial layer;
    forming a dielectric layer over the third III-nitride epitaxial layer;
    forming a first metallic structure electrically coupled to the third III-nitride layer;
    forming a second metallic structure electrically coupled to the second III-nitride layer; and
    forming a metal structure overlying the dielectric layer, wherein the metal structure is electrically coupled to the third III-nitride layer via the first metallic structure and to the second III-nitride layer via the second metallic structure.

12. The method of claim 11 wherein the dielectric layer lines inner walls of the first trench and the second trench.

13. The method of claim 11 further comprising forming a third metallic structure electrically coupled to the III-nitride substrate.

14. The method of claim 11 wherein the first III-nitride epitaxial layer is characterized by a thickness ranging from about 5 μm an to about 100 μm.

15. The method of claim 11 wherein the second III-nitride epitaxial layer is characterized by a thickness ranging from about 100 nm to 1,000 nm.

16. The method of claim 11 wherein the first III-nitride epitaxial layer comprises an n-type GaN layer.

17. The method of claim 11 wherein the third conductivity is same as the first conductivity.

18. The method of claim 11 wherein forming the dielectric layer comprises performing at least one of an Metal-Organic Chemical Vapor Deposition (MOCVD) process or an Atomic Layer Deposition (ALD) process.

19. The method of claim 11 wherein the metal structure fills the first trench and the second trench and a first portion of the metal structure is electrically coupled to the third III-nitride epitaxial layer and a second portion of the metal structure is electrically coupled to the second III-nitride epitaxial layer.

20. The method of claim 11 wherein the dielectric layer comprises at least one of silicon dioxide, silicon oxynitride, silicon gallium nitride, silicon aluminum nitride, aluminum gallium nitride, or aluminum nitride.

* * * * *